(12) United States Patent  (10) Patent No.: US 11,201,173 B2
Shin et al.  (45) Date of Patent: Dec. 14, 2021

(54) ARRAY SUBSTRATE, DISPLAY PANEL AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Mookeun Shin, Beijing (CN); Hui Dong, Beijing (CN); Haifeng Xu, Beijing (CN); Guangying Mou, Beijing (CN); Wei Zhang, Beijing (CN); Kaiwen Wang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/451,168

(22) Filed: Jun. 25, 2019

(65) Prior Publication Data
US 2020/0006390 A1 Jan. 2, 2020

(30) Foreign Application Priority Data
Jul. 2, 2018 (CN) .......................... 201821037357.7

(51) Int. Cl.
H01L 25/18 (2006.01)
H01L 27/12 (2006.01)
H01L 23/00 (2006.01)

(52) U.S. Cl.
CPC .......... *H01L 27/1218* (2013.01); *H01L 24/50* (2013.01); *H01L 25/18* (2013.01)

(58) Field of Classification Search
None
See application file for complete search history.

(56) References Cited

U.S. PATENT DOCUMENTS

| 8,921,994 | B2* | 12/2014 | Higgins, III | ............ H01L 24/97 257/692 |
| 9,269,648 | B2* | 2/2016 | Higgins, III | ............ H01L 24/81 |
| 10,209,542 | B1* | 2/2019 | Shen | .................. G02F 1/13306 |
| 10,209,597 | B1* | 2/2019 | Shen | .................. G02F 1/133514 |
| 2006/0017873 | A1* | 1/2006 | Kim | .................... G02F 1/13452 349/129 |

(Continued)

Primary Examiner — Telly D Green
(74) Attorney, Agent, or Firm — Fay Sharpe LLP

(57) ABSTRACT

Provided are an array substrate, a display panel and a display device. The array substrate includes a display region and a peripheral region. The peripheral region includes a chip-on-film bonding region, and the peripheral region has a recessed structure configured to fill a bonding material. The recessed structure is between the chip-on-film bonding region and a lateral side of the array substrate. The chip-on-film bonding region is between the display region and the lateral side. By disposing a recessed structure configured to fill the bonding material in the peripheral region, a gap is difficult to occur between the chip-on-film in the chip-on-film bonding region and the array substrate, preventing entry of water vapor to cause corrosion of lead wires and short circuits of lead wires. The defect ratio of the array substrate, the display panel, and the display device is reduced, and the product quality is improved.

19 Claims, 5 Drawing Sheets

(56) References Cited

U.S. PATENT DOCUMENTS

| | | | |
|---|---|---|---|
| 2009/0250250 A1* | 10/2009 | Ishii | G02F 1/13452 174/254 |
| 2014/0077349 A1* | 3/2014 | Higgins, III | H01L 24/13 257/692 |
| 2015/0145114 A1* | 5/2015 | Higgins, III | H01L 21/561 257/692 |
| 2016/0148881 A1* | 5/2016 | Park | H01L 23/145 257/659 |
| 2017/0344053 A1* | 11/2017 | Kim | G06F 1/1637 |
| 2018/0031901 A1* | 2/2018 | Kim | G02F 1/133514 |
| 2018/0088387 A1* | 3/2018 | Enami | H05K 1/118 |
| 2018/0212009 A1* | 7/2018 | Odaka | H01L 27/3276 |
| 2019/0148320 A1* | 5/2019 | Chu | H01L 25/18 257/88 |
| 2019/0204669 A1* | 7/2019 | Lee | H01L 24/86 |
| 2019/0204674 A1* | 7/2019 | Jing | G02F 1/1341 |
| 2019/0303085 A1* | 10/2019 | Nagayama | H05K 5/0017 |
| 2019/0384080 A1* | 12/2019 | Jing | G02F 1/133308 |
| 2019/0391454 A1* | 12/2019 | Koide | G02F 1/1345 |
| 2020/0092997 A1* | 3/2020 | Song | H05K 3/361 |
| 2020/0276576 A1* | 9/2020 | Stephen | G01N 1/2813 |

* cited by examiner

ARRAY SUBSTRATE, DISPLAY PANEL AND DISPLAY DEVICE

CROSS-REFERENCE TO RELATED APPLICATION

This application claims priority to Chinese Patent Application No. 201821037357.7, filed on Jul. 2, 2018 and entitled "ARRAY SUBSTRATE, DISPLAY PANEL AND DISPLAY DEVICE", the entire contents of which are incorporated herein by reference.

TECHNICAL FIELD

The present disclosure relates to the field of manufacture of display devices, and more particularly to an array substrate, a display panel and a display device.

BACKGROUND

With the development of mobile terminal devices, more and more display screens, such as the display screens of mobile phones, notebooks, and the like adopt a full screen design.

For a liquid crystal panel, the array substrate needs to be disposed on a color filter (CF) in order to realize a full screen. That is, the array substrate is disposed on a light emergent surface of the liquid crystal panel. The area of the array substrate is greater than the area of the CF, and the region of the area of the array substrate greater than the area of the CF is a bonding region, which is configured to be connected to a drive circuit.

SUMMARY

Embodiments of the present disclosure provide an array substrate, a display panel and a display device.

At least one embodiment of the present disclosure provides an array substrate, comprising: a display region and a peripheral region, wherein the peripheral region comprises a chip-on-film bonding region, the peripheral region has a recessed structure configured to fill a bonding material, the recessed structure is between the chip-on-film bonding region and a lateral side of the array substrate, and the chip-on-film bonding region is between the display region and the lateral side.

In an implementation of the embodiments of the present disclosure, a perpendicular line from any point in the chip-on-film bonding region to the lateral side intersects with the recessed structure.

In an implementation of the embodiments of the present disclosure, the recessed structure comprises at least one of a groove spaced apart from the lateral side and a seam allowance clinging to the lateral side.

In an implementation of the embodiments of the present disclosure, the recessed structure comprises the groove, the peripheral region further comprises an adhesive overflowing region surrounding the chip-on-film bonding region, and a position of the groove is any one of the following two: the groove is in the adhesive overflowing region; and the groove penetrates through the adhesive overflowing region.

In an implementation of the embodiments of the present disclosure, a depth of the recessed structure is 0.2 to 0.3 mm, and a width of the recessed structure is 0.3 to 0.5 mm in a direction perpendicular to the lateral side and parallel to the array substrate.

At least one embodiment of the present disclosure provides a display panel, comprising any one of the array substrates described in the first aspect.

At least one embodiment of the present disclosure provides a display device, comprising an array substrate and a chip-on-film, wherein the array substrate comprises a display region and a peripheral region, the peripheral region comprises a chip-on-film bonding region, and the chip-on-film is connected to the chip-on-film bonding region; the peripheral region has a recessed structure between the chip-on-film bonding region and a lateral side of the array substrate, the chip-on-film bonding region is between the display region and the lateral side, and the recessed structure is filled with a bonding material that bonds the array substrate and the chip-on-film.

In an implementation of the embodiments of the present disclosure, a perpendicular line from any point in the chip-on-film bonding region to the lateral side intersects with the recessed structure.

In an implementation of the embodiments of the present disclosure, the recessed structure comprises at least one of a groove spaced apart from the lateral side and a seam allowance clinging to the lateral side.

In an implementation of the embodiments of the present disclosure, the recessed structure comprises the groove, the peripheral region further comprises an adhesive overflowing region surrounding the chip-on-film bonding region, and a position of the groove is any one of the following two: the groove is in the adhesive overflowing region; and the groove penetrates through the adhesive overflowing region; and the bonding material is anisotropic conductive adhesive.

In an implementation of the embodiments of the present disclosure, the recessed structure is the seam allowance, and the bonding material is ultraviolet curing adhesive.

In an implementation of the embodiments of the present disclosure, a depth of the recessed structure is 0.2 to 0.3 mm.

In an implementation of the embodiments of the present disclosure, a width of the recessed structure is 0.3 to 0.5 mm in a direction perpendicular to the lateral side and parallel to the array substrate.

DETAILED DESCRIPTION

Embodiments of the present disclosure will be described in further detail with reference to the accompanying drawings, to present the principles and advantages of the present disclosure more clearly.

The drive circuit is bonded to a surface of the array substrate facing the CF by a chip-on-film (COF) technology.

In the full screen design, since the array substrate is disposed on the CF, in this case, the overlapping manner of the COF changes from the traditional positive folding to the reverse folding. Positive folding refers to the overlapping manner in which the COF is bent and bypasses the lateral side of the array substrate, and the reverse folding refers to the overlapping manner in which the COF is bent without bypassing the lateral side of the array substrate. In the case of adopting the overlapping manner of reverse folding, when the COF is subjected to a lateral force, the bonding region between the COF and the array substrate is in a pulling state. Under the long-term cycle of tensile stress, a gap easily occurs between the COF and the array substrate, and the water vapor enters by the gap, which is likely to cause the short circuit of a lead wire in the bonding region.

Figure 1:
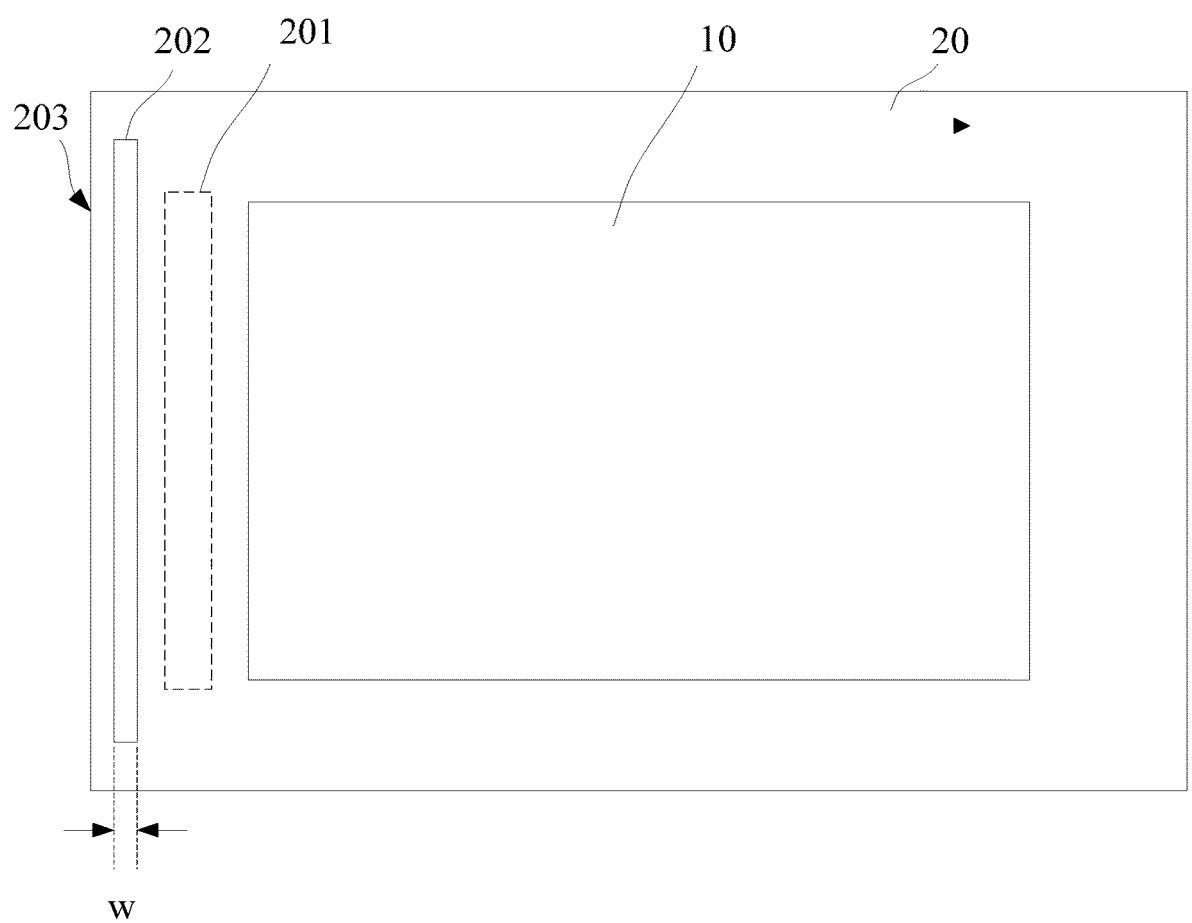
FIG. 1 is a structural schematic diagram of an array substrate according to an embodiment of the present disclosure.

FIG. 1 is a structural schematic diagram of an array substrate provided in the present disclosure. Referring to FIG. 1, the array substrate includes a display region 10 and a peripheral region 20. The peripheral region 20 includes a chip-on-film bonding region 201. The peripheral region 20 has a recessed structure 202 configured to fill a bonding material. The recessed structure 202 is between the chip-on-film bonding region 201 and a lateral side 203 of the array substrate, and the lateral side 203 is a lateral side of the array substrate close to the chip-on-film bonding region. The chip-on-film bonding region 201 is between the display region 10 and the lateral side 203.

Here, the lateral side 203 is a side of the array substrate close to the chip-on-film bonding region 201. When a gap occurs between the chip-on-film and the array substrate, water vapor enters from this side.

In the display field, the display region 10 of an array substrate is generally a region configured to arrange pixel units, while the peripheral region 20 is a region surrounding the display region 10 and configured to arrange peripheral circuits.

In the embodiments of the present disclosure, the base substrate of the array substrate is generally made of glass, a silicon material, or the like, and the adhesiveness between the bonding material and the base substrate of the array substrate is less than the adhesiveness between the bonding material and the chip-on-film. Thus, the bonding strength between the bonding material and the base substrate of the array substrate is less than the bonding strength between the bonding material and the chip-on-film.

According to the present disclosure, a recessed structure between the chip-on-film bonding region and the lateral side of the array substrate is disposed in the peripheral region. When the chip-on-film is bonded to the array substrate, the recessed structure is filled with the bonding material to bond the chip-on-film on the array substrate. Since the bonding strength between the bonding material and the base substrate is less than the bonding strength between the bonding material and the chip-on-film, when the chip-on-film is subjected to a relatively large lateral force, a gap firstly occurs between the bonding material and the array substrate. But the gap is at the bottom of the recessed structure, the friction force between the bonding material and the sidewall of the recessed structure prevents the bonding material from being completely separated from the recessed structure, and the force which is originally applied to the chip-on-film bonding region reduces, such that the gap is difficult to occur between the chip-on-film in the chip-on-film bonding region and the array substrate, thereby avoiding the corrosion of a lead wire caused by the entry of water vapor and short circuits of the lead wire. The defect ratio of the array substrate, the display panel, and the display device is reduced, and the product quality is improved.

As shown in FIG. 1, in the array substrate shown in FIG. 1, the chip-on-film is connected to the chip-on-film bonding region 201 through one side of the lateral side 203, and the chip-on-film bonding region 201 is provided with a connecting terminal (i.e., a bonding pad), to be overlapped with the chip-on-film.

In the present embodiment, the recessed structure 202 separates the chip-on-film bonding region 201 from the lateral side. Separating the chip-on-film bonding region 201 from the lateral side by recessed structure 202 means that the perpendicular line from any point in the chip-on-film bonding region 201 to the lateral side 203 intersects with the recessed structure 202. When the chip-on-film is subjected to a relatively large lateral force, even if a gap occurs between the chip-on-film in the chip-on-film bonding region and the array substrate, corrosion caused by water vapor can still be avoided for the following reasons: the gap between the bonding material and the array substrate is at the bottom of the recessed structure, the bonding material and the sidewall of the recessed structure are still sealed, and the recessed structure separates the chip-on-film bonding region from the lateral side. Thus, in this circumstance, water vapor still cannot enter the chip-on-film bonding region.

In the present embodiment, the recessed structure 202 includes at least one of a groove spaced apart from the lateral side 203 and a seam allowance clinging to the lateral side 203. The structures of the groove 221 and the seam allowance 222 will be separately described below with reference to FIG. 2 to FIG. 4.

As shown in FIG. 1, in the embodiment of the present disclosure, the recessed structure 202 may be a groove.

The groove may be strip-shaped, such as a linear strip-shaped groove and a wave strip-shaped groove. In other embodiments, the groove may also be in other shapes, such as a semi-circular groove or a trapezoidal groove, which is not limited in the present disclosure.

Figure 2:
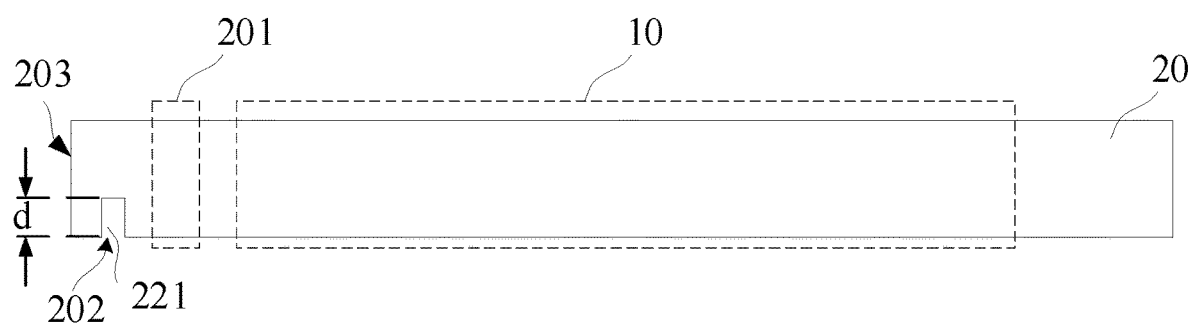
FIG. 2 is a structural schematic diagram of an array substrate according to an embodiment of the present disclosure.

FIG. 2 is a side view of the array substrate provided in FIG. 1. Referring to FIG. 2, the cross section of the groove 221 is rectangular. In other embodiments, the cross section of the groove 221 may also be trapezoidal, semi-circular, and irregularly-shaped, which is not limited in the present disclosure.

In the present embodiment, the size range of the recessed structure 202 may be designed in the following manner: the depth d (referring to FIG. 2) ranges from 0.2 to 0.3 mm, and the width w (referring to FIG. 1) ranges from 0.3 to 0.5 mm. Here, the width of the recessed structure 202 refers to the maximum distance between the two lateral sides of the recessed structure 202 in the direction perpendicular to the lateral side 203 of the array substrate and parallel to the array substrate. The recessed structure 202 of the above size can prevent corrosion by filling the bonding material on the one hand, and will not occupy a too large area of the array substrate to affect the design of other structure on the other hand.

In the array substrate shown in FIG. 2, the bonding material in the recessed structure 202 may be ultraviolet curing adhesive. The bonding material in the recessed structure 202 may also be anisotropic conductive adhesive.

Figure 3:
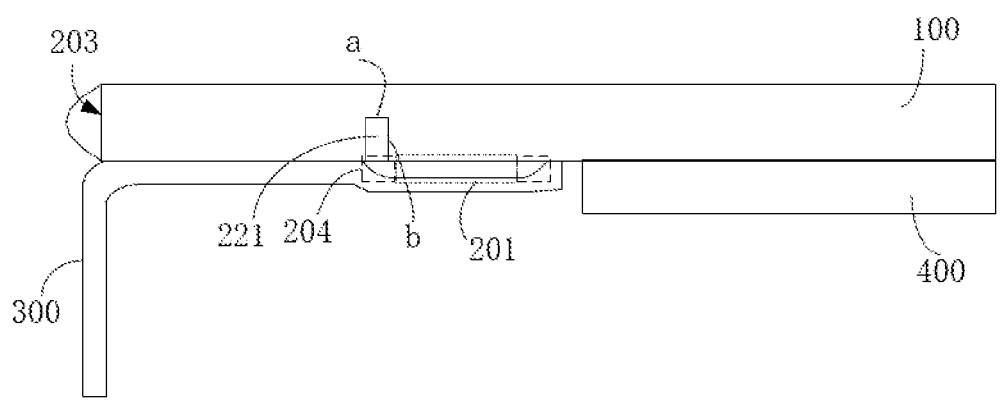
FIG. 3 is a structural schematic diagram of an array substrate according to an embodiment of the present disclosure.

FIG. 3 is a structural schematic diagram of an array substrate according to an embodiment of the present disclosure. The array substrate 100 shown in FIG. 3 differs from that in FIG. 1 only in the position of the recessed structure 202. Referring to FIG. 3, the peripheral region 20 further includes an adhesive overflowing region 204 surrounding the chip-on-film bonding region 201. The recessed structure 202 is in the adhesive overflowing region 204, or the recessed structure 202 penetrates through the adhesive overflowing region 204.

Exemplarily, when the chip-on-film is overlapped with the array substrate, the anisotropic conductive adhesive is usually adopted for bonding, and the anisotropic conductive adhesive needs to be pressed during bonding. In this case, the bonding material overflows to the periphery from the chip-on-film bonding region 201 (also referred to as an orthobaric region). The region which the bonding material overflows to is the adhesive overflowing region 204. The recessed structure 202 is disposed in the adhesive overflowing region 204, or the recessed structure 202 penetrates through the adhesive overflowing region 204, so that the process of filling the bonding material can be completed during the bonding process of the chip-on-film and the array substrate, that is, the bonding material filling the recessed structure 202 is the anisotropic conductive adhesive. Exemplarily, during the bonding process of the chip-on-film and the array substrate, when the chip-on-film bonding region 201 is pressed, the anisotropic conductive adhesive flows toward the surrounding adhesive overflowing region 204, to be filled into the recessed structure 202.

Here, penetrating, by the recessed structure 202, through the glue overflowing region 204 means that at least one end of the recessed structure 202 protrudes out of the adhesive overflowing region 204. However, since part of the recessed structure 202 is in the adhesive overflowing region 204, the anisotropic conductive adhesive still can flow into the recessed structure 202 when the anisotropic conductive adhesive is pressed.

FIG. 3 further shows the positional relationship between the chip-on-film 300 and the color filter substrate 400. Referring to FIG. 3, the area of the array substrate 100 is greater than the area of the color filter substrate 400. Thus, in the design of a display panel with no frame at four sides (i.e., full screen), the array substrate 100 having a greater area needs to be disposed above the color filter substrate 400, that is, the array substrate 100 is disposed on the light emergent surface of the display panel. For the above arrangement manner of the array substrate 100, the chip-on-film bonding region of the array substrate 100 is on the bottom surface thereof, i.e., the side facing the backlight source. In this case, the chip-on-film 300 is disposed under the array substrate 100.

The chip-on-film bonding region 201 is generally disposed in the gate electrode layer of the array substrate, and thus the recessed structure 202 penetrates through the gate electrode layer and the base substrate. Exemplarily, the base substrate is generally made of glass or the like. So, the bonding strength between the bonding material and the array substrate is less than the bonding strength between the bonding material and the chip-on-film. Therefore, when the chip-on-film is subjected to an excessive lateral force, a gap firstly occurs between the bonding material and the array substrate. However, since the gap is at the bottom of the recessed structure (reference sign a in FIG. 3), and the bonding material and the sidewall (reference sign b in FIG. 3) of the recessed structure are still sealed, the water vapor still cannot enter the chip-on-film bonding region in this circumstance. Thus, corrosion on the lead wire in the chip-on-film bonding region is avoided, and the problem of short circuits of the lead wire is avoided.

Referring to FIG. 3, the chip-on-film 300 is bonded to the array substrate 100 by anisotropic conductive adhesive. Since the recessed structure 202 passes through the adhesive overflowing region 204, the anisotropic conductive adhesive enters the recessed structure 202 when being pressed. Therefore, when the array substrate 100 and the chip-on-film 300 are bonded, the recessed structure 202 does not need to be filled with the bonding material additionally.

In FIG. 3, the recessed structure is disposed in the adhesive overflowing region 204. Since the width of the adhesive overflowing region 204 is relatively small, the width of the recessed structure is also designed to be relatively small. For example, the width of the recessed structure 202 may be 0.3 mm.

It is to be explained that the recessed structures in FIG. 3 and FIG. 2 may be combined, that is, two grooves may be disposed to jointly form a recessed structure. Alternatively, one groove in FIG. 2 and a plurality of grooves in FIG. 3 may be disposed, or a plurality of grooves in FIG. 2 and one groove in FIG. 3 may be disposed, or a plurality of grooves in FIG. 2 and a plurality of grooves in FIG. 3 may be disposed to jointly form a recessed structure.

Figure 4:
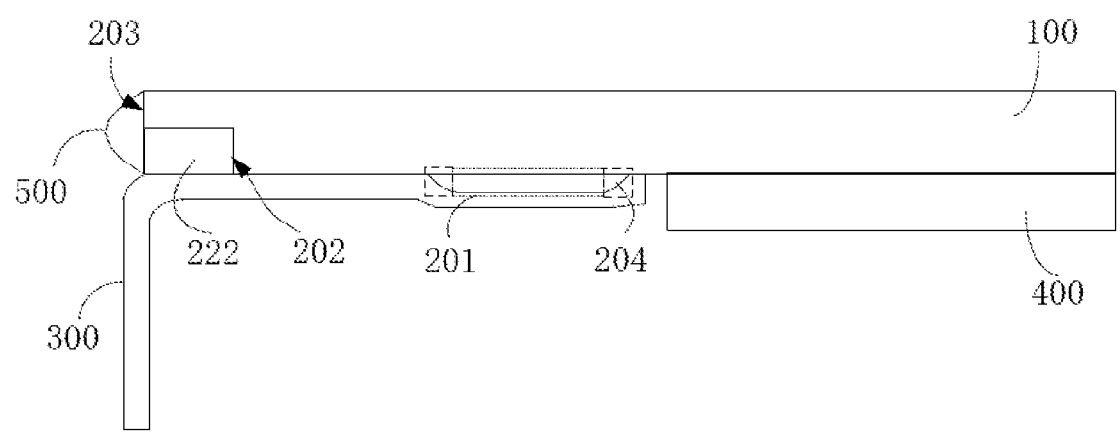
FIG. 4 is a structural schematic diagram of an array substrate according to an embodiment of the present disclosure.

FIG. 4 is a structural schematic diagram of an array substrate according to an embodiment of the present disclosure. The array substrate 100 shown in FIG. 4 differs from the array substrates FIG. 1 and FIG. 3 in the shape and position of the recessed structure 202. Referring to FIG. 4, the recessed structure 202 is a seam allowance 222 clinging to the lateral side 203 of the array substrate.

In the assembly process of the display panel, side adhesive 500 is applied to the lateral side of the array substrate. The side adhesive 500 and the seam allowance 222 form a groove structure, and the shape of the groove structure may be the same as the shape of grooves shown in FIG. 2 and FIG. 3. Here, the side adhesive 500 plays a function of preventing light leakage at the edge of the array substrate 100. The model of the side adhesive 500 may be EX-380N with a certain bonding strength.

In the array substrate shown in FIG. 4, the bonding material in the recessed structure 202 may be ultraviolet curing adhesive, which has lower cost than the anisotropic conductive adhesive. Of course, the bonding material in the recessed structure 202 may also be anisotropic conductive adhesive.

The size of the recessed structure 202 in FIG. 4 may be exactly the same as or may be different from the size of the recessed structure in FIG. 3. For example, the width of the recessed structure 202 in FIG. 4 may be greater than the width of the recessed structure in FIG. 3. For example, the width of the recessed structure 202 in FIG. 4 may be 0.5 mm.

In the structure shown in FIG. 4, since the seam allowance 222 cooperates with the side adhesive 500 to form a groove, after the bonding material is filled in the seam allowance 222, the bonding material is connected to the side adhesive, thereby increasing the bonding strength between the bonding material and the array substrate. The gap is not likely to occur when force is applied. In addition, even when the chip-on-film is subjected to an excessive lateral force, a gap occurs first between the bonding material and the array substrate. However, since the gap is at the bottom of the recessed structure, and the bonding material and the sidewall of the recessed structure are still sealed, the water vapor still cannot enter the chip-on-film bonding region in this circumstance. Thus, corrosion on the lead wire in the chip-on-film bonding region is avoided and the problem of short circuits of the lead wire is avoided.

It is to be explained that the recessed structures in FIG. 4 and FIG. 2 (or FIG. 3) may be combined, that is, the groove 221 and the seam allowance 222 may be disposed to jointly form the recessed structure. Alternatively, the recessed structures in FIG. 4, FIG. 2, and FIG. 3 may be combined, that is, two types of grooves 221 and the seam allowance 222 may be disposed to jointly form the recessed structure. In addition, the amount of the grooves and seam allowances is not limited.

The embodiment of the present disclosure further provides a display panel, including the array substrate as shown in any one of FIG. 1 to FIG. 4.

According to the embodiment of the present disclosure, the recessed structure between the chip-on-film bonding region and the lateral side of the array substrate is disposed in the peripheral region. When the chip-on-film is bonded to the array substrate, the recessed structure is filled with the bonding material to bond the chip-on-film on the array substrate. Since the bonding strength between the bonding material and the base substrate is less than the bonding strength between the bonding material and the chip-on-film, when the chip-on-film is subjected to a relatively large lateral force, a gap firstly occurs between the bonding material and the array substrate. But the gap is at the bottom of the recessed structure, the friction force between the bonding material and the sidewall of the recessed structure prevents the bonding material from being completely separated from the recessed structure, and the force which is originally applied to the chip-on-film bonding region reduces, such that the gap is difficult to occur between the chip-on-film in the chip-on-film bonding region and the array substrate, thereby preventing the corrosion of a lead wire caused by the entry of water vapor and avoiding the problem of short circuits of the lead wire. The defect ratio of the array substrate, the display panel, and the display device is reduced, and the product quality is improved.

Figure 5:
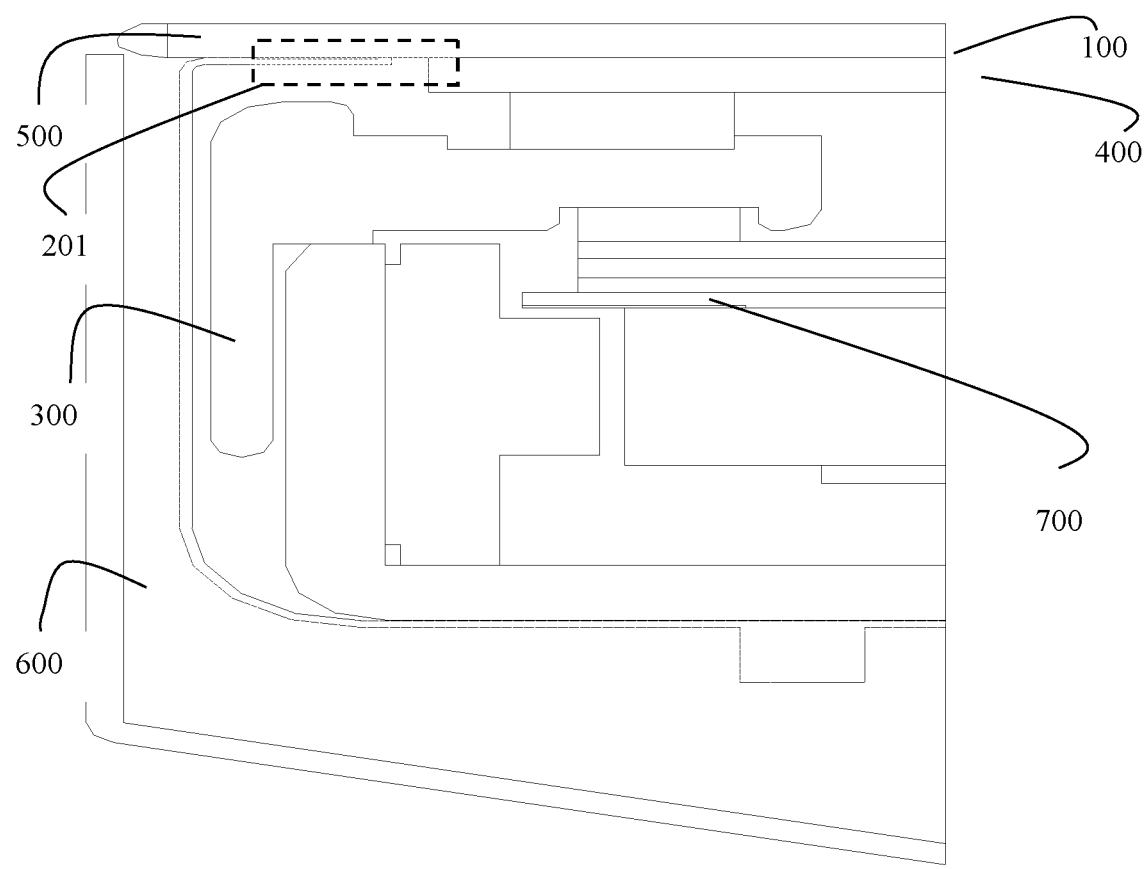
FIG. 5 is a structural schematic diagram of a display device according to an embodiment of the present disclosure.

FIG. 5 is a structural schematic diagram of a display device according to an embodiment of the present disclosure. Referring to FIG. 5, the display device includes an array substrate 100 and a chip-on-film 300. The array substrate is the array substrate as shown in any one of FIG. 1 to FIG. 4. The chip-on-film 300 is connected to the chip-on-film bonding region 201, and the recessed structure 202 is filled with a bonding material for bonding the array substrate 100 and the chip-on-film 300.

In the present embodiment, the recessed structure 202 separates the chip-on-film bonding region 201 from the lateral side 203.

In the present embodiment, the recessed structure 202 includes at least one of a groove 221 spaced apart from the lateral side 203 and a seam allowance 222 clinging to the lateral side 203.

When the structure of the array substrate shown in FIG. 3 is adopted, the recessed structure 202 is a groove 221, and the peripheral region further includes an adhesive overflowing region 204 surrounding the chip-on-film bonding region 201. The groove 221 is in the adhesive overflowing region 204. Alternatively, the groove 221 penetrates through the adhesive overflowing region 204. The bonding material may be anisotropic conductive adhesive, the detailed structure of which may be made reference to the description about FIG. 3 above.

When the structure of the array substrate shown in FIG. 4 is adopted, the recessed structure 202 is a seam allowance 222 clinging to the lateral side of the array substrate, and the bonding material may be ultraviolet curing adhesive, the detailed structure of which may be made reference to the description about FIG. 4 above.

Referring to FIG. 5, the backlight source 700 of the display device is below the color filter substrate 400 and provides backlight for the entire display device.

Referring to FIG. 5, the housing 600 of the display device is configured to encapsulate the entire display device, and one side of the housing is connected to side adhesive 500 of the array substrate. The chip-on-film 300, the backlight source 700, and other necessary circuit components of the display device are wrapped in the housing 600.

The assembly process of the device is as follows. An array substrate is provided. The array substrate is the array substrate as shown in any one of FIG. 1 to FIG. 4. The chip-on-film 31 and the chip-on-film bonding region 201 of the array substrate 100 are bonded, and the recessed structure 202 is filled with colloid before or during bonding, so that the chip-on-film 300 and the array substrate 100 are bonded at the recessed structure 202 as well.

The assembly process of the display device provided in the embodiment of the present disclosure is described below with respect of the above two structures of the array substrate respectively.

When the array substrate shown in FIG. 3 is adopted, the assembly process of the display device is as follows. A groove is set in the adhesive overflowing region of the array substrate. In the process of bonding the chip-on-film 300 to the array substrate 100, the anisotropic conductive adhesive overflows from the chip-on-film bonding region after being heated and pressed, and the overflowed adhesive enters the groove. After being filled with the overflowed adhesive, the groove forms a sealing region with the array substrate. After the groove is filled with the anisotropic conductive adhesive, water vapor is well isolated outside the groove filled with the anisotropic conductive adhesive. As a result, water vapor cannot further enter the chip-on-film bonding region along the array substrate, thereby eliminating the problem that water vapor in the bonding region enters the chip-on-film bonding region to corrode the lead wire to cause short circuit and bright line defect.

When the array substrate shown in FIG. 4 is adopted, the assembly process of the display device is as follows. A corner at the periphery of the array substrate is cut to form a seam allowance. Ultraviolet curing adhesive is applied to the seam allowance. The chip-on-film and the array substrate are bonded (including bonding of the chip-on-film bonding region and bonding at the seam allowance). Ultraviolet rays are adopted to irradiate the ultraviolet curing adhesive at the seam allowance through the array substrate, to cure the ultraviolet curing adhesive. The lateral side of the array substrate is coated with the side adhesive to form a sealing structure with the ultraviolet curing adhesive. After the side adhesive and the ultraviolet curing adhesive form the sealing structure, even if the chip-on-film is subjected to an excessive lateral force, and a certain gap occurs in a weak bonding region, that is, the contact region between the ultraviolet curing adhesive and the array substrate, there is no access for external water vapor to enter as the gap is at the bottom of the bonding material, thereby effectively preventing corrosion of the lead wire in the chip-on-film bonding region. In addition, after being cured, the ultraviolet curing adhesive is tightly combined with the lateral side of the recessed structure of the array substrate, to form a sealing region, which further isolates external water vapor.

The foregoing descriptions are only exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. An array substrate, comprising: a display region and a peripheral region, wherein the peripheral region comprises a chip-on-film bonding region, the peripheral region has a recessed structure configured to fill a bonding material, an entire structure of the recessed structure is between the chip-on-film bonding region and a lateral side of the array substrate, and the recessed structure is a groove spaced apart from the lateral side;

the peripheral region further comprises an adhesive overflowing region surrounding the chip-on-film bonding region, and the groove is in the adhesive overflowing region or penetrates through the adhesive overflowing region; and the chip-on-film bonding region is between the display region and the lateral side.

2. The array substrate according to claim 1, wherein a perpendicular line from any point in the chip-on-film bonding region to the lateral side intersects with the recessed structure.

3. The array substrate according to claim 1, wherein a depth of the recessed structure is 0.2 to 0.3 mm.

4. The array substrate according to claim 1, wherein a width of the recessed structure is 0.3 to 0.5 mm in a direction perpendicular to the lateral side and parallel to the array substrate.

5. A display panel, comprising an array substrate; wherein the array substrate comprises: a display region and a peripheral region, wherein the peripheral region comprises a chip-on-film bonding region, the peripheral region has a recessed structure configured to fill a bonding material, an entire structure of the recessed structure is between the chip-on-film bonding region and a lateral side of the array substrate, and the recessed structure is a groove spaced apart from the lateral side;

the peripheral region further comprises an adhesive overflowing region surrounding the chip-on-film bonding region, and the groove is in the adhesive overflowing region or penetrates through the adhesive overflowing region; and the chip-on-film bonding region is between the display region and the lateral side.

6. The display panel according to claim 5, wherein a perpendicular line from any point in the chip-on-film bonding region to the lateral side intersects with the recessed structure.

7. The display panel according to claim 5, wherein a depth of the recessed structure is 0.2 to 0.3 mm.

8. The display panel according to claim 5, wherein a width of the recessed structure is 0.3 to 0.5 mm in a direction perpendicular to the lateral side and parallel to the array substrate.

9. A display device, comprising an array substrate and a chip-on-film, wherein the array substrate comprises a display region and a peripheral region, the peripheral region comprises a chip-on-film bonding region, and the chip-on-film is connected to the chip-on-film bonding region;

the chip-on-film and the chip-on-film bonding region are in a reverse folding status;

the peripheral region has a recessed structure configured to fill a bonding material, an entire structure of the recessed structure is between the chip-on-film bonding region and a lateral side of the array substrate, and the recessed structure is a groove spaced apart from the lateral side;

the peripheral region further comprises an adhesive overflowing region surrounding the chip-on-film bonding region, and the groove is in the adhesive overflowing region or penetrates through the adhesive overflowing region;

the chip-on-film bonding region is between the display region and the lateral side, the recessed structure is filled with a bonding material that bonds the array substrate and the chip-on-film, and the bonding material is one of anisotropic conductive adhesive or ultraviolet curing adhesive.

10. The display device according to claim 9, wherein a perpendicular line from any point in the chip-on-film bonding region to the lateral side intersects with the recessed structure.

11. The display device according to claim 9, wherein the bonding material is ultraviolet curing adhesive.

12. The display device according to claim 9, wherein a depth of the recessed structure is 0.2 to 0.3 mm.

13. The display device according to claim 9, wherein a width of the recessed structure is 0.3 to 0.5 mm in a direction perpendicular to the lateral side and parallel to the array substrate.

14. The display device according to claim 9, wherein the reverse folding status refers to a status in which the chip-on-film is folded and bent reversely and does not pass the lateral side of the array substrate.

15. The display device according to claim 9, wherein the recessed structure is full of the bonding material.

16. The display device according to claim 9, wherein the bonding material and sidewalls of the recessed structure are sealed, so as to prevent water vapor from entering the chip-on-film bonding region.

17. The display device according to claim 9, wherein the chip-on-film bonding region is provided with a connecting terminal for connecting with the chip-on-film.

18. The display device according to claim 9, wherein the bonding material is anisotropic conductive adhesive, and the anisotropic conductive adhesive flows towards the adhesive overflowing region surrounding the chip-on-film bonding region, and then fills the recessed structure.

19. The display device according to claim 9, wherein at least one end of the recessed structure is protruded out of the adhesive overflowing region.

* * * * *